US011480605B2

(12) United States Patent
Denk et al.

(10) Patent No.: US 11,480,605 B2
(45) Date of Patent: Oct. 25, 2022

(54) METHOD AND APPARATUS FOR DETECTING AGEING OF A POWER ELECTRONIC APPARATUS COMPRISING A SEMICONDUCTOR COMPONENT, AND POWER ELECTRONIC SYSTEM

(71) Applicant: ZF Friedrichshafen AG, Friedrichshafen (DE)

(72) Inventors: Marco Denk, Memmelsdorf (DE); Mark-Matthias Bakran, Erlangen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 1103 days.

(21) Appl. No.: 16/062,518

(22) PCT Filed: Nov. 22, 2016

(86) PCT No.: PCT/EP2016/078428
§ 371 (c)(1),
(2) Date: Jun. 14, 2018

(87) PCT Pub. No.: WO2017/102262
PCT Pub. Date: Jun. 22, 2017

(65) Prior Publication Data
US 2022/0034958 A1 Feb. 3, 2022

(30) Foreign Application Priority Data
Dec. 18, 2015 (DE) ...................... 10 2015 225 909.9

(51) Int. Cl.
*G01R 31/00* (2006.01)
*G01R 31/26* (2020.01)
*G01R 31/28* (2006.01)

(52) U.S. Cl.
CPC ....... *G01R 31/2642* (2013.01); *G01R 31/002* (2013.01); *G01R 31/2834* (2013.01);
(Continued)

(58) Field of Classification Search
CPC ......... H01L 2924/0002; H01L 2924/00; H01L 2224/48091; G01R 31/2834;
(Continued)

(56) References Cited

U.S. PATENT DOCUMENTS

2009/0058307 A1* 3/2009 Bertram ................ H05B 45/22
315/157
2014/0242622 A1* 8/2014 Petrich ............... G01N 21/6428
435/26
(Continued)

FOREIGN PATENT DOCUMENTS

DE    10 2010 000 875 A1    7/2011
DE    10 2011 119 184 A1    5/2013
(Continued)

OTHER PUBLICATIONS

DE102013211038 Machine Translation; Jun. 13, 2013 (Year: 2013).*
(Continued)

*Primary Examiner* — Raul J Rios Russo
(74) *Attorney, Agent, or Firm* — Crowell & Moring LLP

(57) ABSTRACT

A method for detecting the aging of a power electronic device that comprises at least one semiconductor component including a step of providing of an excitation signal, which is designed to trigger a flow of an at least approximately semi-sinusoidal excitation current through the semiconductor component in order to introduce a power loss into the semiconductor component, a step of uploading a temperature signal, which represents the temporal course of the temperature of the semiconductor component, and a step of determining of an aging value that represents the aging of the power electronic device by using the temperature signal.

16 Claims, 5 Drawing Sheets

(52) U.S. Cl.
CPC ...... *G01R 31/2851* (2013.01); *G01R 31/2891* (2013.01); *H01L 2224/48091* (2013.01); *H01L 2924/00* (2013.01); *H01L 2924/0002* (2013.01)

(58) Field of Classification Search
CPC .............. G01R 31/2851; G01R 31/002; G01R 31/2642; G01R 31/2891
USPC ......... 324/71, 378, 403, 415, 425, 500, 537, 324/750.01
See application file for complete search history.

(56) References Cited

U.S. PATENT DOCUMENTS

| | | | | |
|---|---|---|---|---|
| 2015/0233853 | A1* | 8/2015 | Seefried | H03K 17/954 324/655 |
| 2017/0073728 | A1* | 3/2017 | Petrich | A61B 5/1495 |
| 2017/0134028 | A1* | 5/2017 | Hammes | H03L 1/026 |
| 2017/0309539 | A1* | 10/2017 | Wei mann | G01J 5/0007 |

FOREIGN PATENT DOCUMENTS

| | | |
|---|---|---|
| DE | 10 2013 211 038 B3 | 10/2014 |
| DE | 10 2014 206 621 A1 | 10/2015 |
| EP | 2 615 467 A1 | 7/2013 |

OTHER PUBLICATIONS

German Office Action dated Apr. 25. 2016, for German Patent Application No. 10 2015 225 909.9 (in German) (10 pages).
English translation of p. 10 of German Office Action dated Apr. 25. 2016, for German Patent Application No. 10 2015 225 909.9 (2 pages).
International Search Report for International Search Authority for International PCT Application No. PCT/EP2016/078428, dated Feb. 28, 2017, (English translation) (2 pages).
International Search Report and Written Opinion of International Search Authority for International PCT Application No. PCT/EP2016/078428, dated Feb. 28, 2017 (in German) (11 pages).

* cited by examiner

METHOD AND APPARATUS FOR DETECTING AGEING OF A POWER ELECTRONIC APPARATUS COMPRISING A SEMICONDUCTOR COMPONENT, AND POWER ELECTRONIC SYSTEM

RELATED APPLICATIONS

This application claims the benefit under 35 U.S.C. § 371 of the filing date of International Patent Application PCT/EP2016/078428, having an international filing date of Nov. 22, 2016, which claims the benefit of and priority to German Patent Application DE 10 2015 225 909.9, filed on Dec. 18, 2015, both of which are incorporated by reference herein in their entirety.

BACKGROUND

1. Technical Field

The present invention refers to a method and a device for detecting an aging of a power electronic device and a power electronic system comprising a semiconductor component.

2. Background Information

Power semiconductor modules, in particular IGBT-power semiconductor modules (IGBT=insulated-gate bipolar transistor) are the key components of current development trends, such as the electric or hybrid electric drive technology or in the generation of energy from regenerative sources, e.g. from wind energy. Due to operational and external influences, these power modules are subject to a steady aging process, which can lead to the age-related failure of the power module over a longer period of time. In order to ensure a certain target lifespan, the herein used calculation approach contains "robustness margins", which can lead to an over-dimensioning of the power module. Ever rising power densities require the operation of a power module near its load limit and the reduction of the robustness margins. To ensure a specific lifespan is thus difficult.

In this context, the present invention provides an improved method and an improved device for detecting an aging of a power electronic device as well as of an improved power electronic system according to the main claims which comprise at least one semiconductor component. Advantageous design examples can be derived from the sub-claims and from the following description.

BRIEF SUMMARY

The aging of a power electronic device that comprises at least one semiconductor component can advantageously be analyzed by means of a semi-sinusoidal excitation of the semiconductor component.

A corresponding method for detecting the aging of a power electronic device that comprises at least one semiconductor component includes the following steps: providing of an excitation signal, which is designed to cause a flow of an at least approximately semi-sinusoidal excitation current through the semiconductor component in order to introduce a power loss into the semiconductor component; uploading of a temperature signal which represents the temporal course of the temperature of the semiconductor component; and determining of an aging value that represents the aging of the power electronic device by using the temperature signal.

A power electronic device can be understood to be a circuit which comprises at least one semiconductor component, e.g. in form of a transistor or a diode. The semiconductor component can refer to a power semiconductor component as it is used in the power electronics. The aging can affect an electrical or thermal conduction within the power electronic device. Due to the aging, it is e.g. possible that an electrical or thermal resistance of such a conduction increases. By means of the aging value, it is e.g. possible to display a degree of the aging or a condition of such a conduction based on a pre-defined scale. The excitation signal can be understood to be an electrical signal, by means of which the semiconductor component is directly triggered, or at least a further component of the power electronic device is triggered in such a way, that the semi-sinusoidal excitation current flows through the semiconductor component. Alternatively, the excitation signal can also represent the excitation current. An at least semi-sinusoidal form can be understood to be a course of the excitation current that can be viewed as a half-oscillation. In order that the excitation current can flow through the semiconductor component, the semiconductor component can be operated in conducting direction. The excitation current can feature a value that is common in the power electronics, e.g. a maximum value of more than 50 A. A frequency of the excitation current can e.g. range between 0.5 Hz and 2 Hz. The frequency can correspond or be adapted to a low-pass frequency of a substrate, in particular of a ceramics substrate, onto which the semiconductor component is soldered.

By means of the excitation current, it is possible to introduce at least an approximately semi-sinusoidal power loss into the semiconductor component, which causes a change of the temperature of the semiconductor component. An oscillation in the course of the temperature can be caused by means of the semi-sinusoidal excitation current. The temperature can refer to a temperature within the semiconductor component, e.g. to a junction temperature. The temperature signal can be determined by carrying out a suitable method for measuring. The temperature can thereby be detected while the excitation current flows through the semiconductor component.

The described approach allows for an identification and a monitoring of the aging condition of a power module that is e.g. installed in an inverter. By means of an evaluation of the aging value, it is advantageously possible to prevent an age-related spontaneous module failure. This can reduce the costs and increase the operational reliability. According to one embodiment, a solution for determining the aging condition of the power module and cooling system, which is suitable for series production, is made possible within a power electronic system ("onboard").

According to one embodiment, it is possible to determine the aging value by using an amplitude of the temperature signal during the step of determining. It is easy to determine the amplitude of an oscillation of the temperature signal and advantageously, there is a connection to the aging of the semiconductor component. Additionally or alternatively, it is possible to determine the aging value by using a minimum value of the temperature signal during the step of determining. The minimum value of the temperature signal can also be detected in a simple manner and advantageously, there is a connection to the aging at a heat sink of the semiconductor component.

It is e.g. possible to determine the aging value by means of a comparison between the amplitude and a reference amplitude during the step of determining. Additionally or alternatively, it is possible to determine the aging value by means of a comparison between the minimum value and a reference minimum value. The reference amplitude and the reference minimum value can represent reference values that are allocated to a pre-determined aging condition. It is also possible to provide several reference amplitudes and several reference minimum values as values for comparison, so that it is possible to determine the aging with high precision.

A first aging value, which indicates an aging at the semiconductor component, can thus be determined during the step of determining, if the amplitude is bigger than the reference amplitude. Additionally or alternatively, it is possible to determine a second aging value, which indicates an aging of a cooling device of the power electronic device, if the minimum value is greater than the reference minimum value. In this manner, an aging pertaining to the semiconductor component and a cooling device can thus be determined and indicated separately.

By means of a comparison between the thermal resistance and a thermal reference resistance during the step of determining, it is furthermore possible to determine the aging value.

The thermal resistance can hereby be determined by using the amplitude, the minimum value and the power loss introduced into the semiconductor component. In this way, the aging can be determined directly from a value of a thermal resistance within the power electronic device.

The aging value can be determined by using an average amplitude and additionally or alternatively by using an average minimum value of the temperature signal during the step of determining. The averaging can be carried out by means of a plurality of semi-sinusoidal waves. This results in a large time constant, by means of which the accuracy of the determining of the aging can be increased.

According to one embodiment, it is possible to determine the aging value during the step of determining, when the temperature signal features a steady oscillation state. The steady oscillation state represents a defined measuring condition, so that certain aging values can be compared to each other at different points in time.

In the step of uploading, the temperature signal can be introduced via an interface into a resistance within the semiconductor component. Such a resistance enables a very accurate determination of the actual temperature within the semiconductor component. Advantageously, semiconductor components are usually equipped with such a resistance, e.g. in form of a gate resistance, and a well-known method can be used to detect the temperature by using such a resistance.

According to one embodiment, the semiconductor component can refer to a transistor. During the step of providing, the excitation signal can be provided at a control input of the transistor. In this way, the excitation current can advantageously be directly adjusted by using the semiconductor component.

The power electronic device can comprise at least one further semiconductor component. During the step of providing, the excitation signal, which is designed to cause a flow of a further semi-sinusoidal excitation current through the additional semiconductor component, can be provided in order to introduce a further power loss into the additional semiconductor component. In the step of uploading, a further temperature signal can be upload, which represents a temporal course of the temperature of the additional semiconductor component. In the step of determining, it is possible to determine a further aging value, which represents the aging of the power electronic device, by the use of the additional temperature signal. In this way, an aging value that can be allocated to the respective semiconductor component can be determined for each semiconductor component of the power electronic device. According to various design examples, one and the same excitation signal can be provided to the semiconductor components or the excitation signal can include a plurality of partial excitation signals that are provided to the semiconductor components. The partial excitation signals can be matched towards each other in such a way, that a semi-sinusoidal excitation current flows through each one of the semiconductor components. This can be done e.g. for a bridge circuit that is made up of at least two semiconductor components. The excitation currents of the individual semiconductor components can thereby be identical or different, for example with a phase-shift towards each other.

A device for detecting an aging of a power electronic device comprising at least one semiconductor component features the following characteristics: a provision unit for providing an excitation signal, which is designed to cause a flow of an at least approximately semi-sinusoidal excitation current through the semiconductor component in order to introduce a power loss into the semiconductor component; an uploading unit for uploading of a temperature signal which represents a temporal course of the temperature of the semiconductor component; and a determination unit for determining an aging value that represents the aging of the power electronic device by using the temperature signal.

In accordance with one embodiment, the provision unit can refer to a driver circuit to operate the semiconductor component, which is required anyway. An example of such a driver circuit is a pulse width modulation driver of an inverter.

The device may include units that are designed to implement the steps of an embodiment of the mentioned method for detecting an aging of a power electronic device comprising at least one semiconductor component. A device can refer to an electrical device which processes electric signals, e.g. sensor signals and which sends out corresponding control signals. The device may feature one or several suitable interfaces, which can be implemented via hardware and/or software. For a hardware configuration, the interfaces can e.g. be part of an integrated circuit in which the functions of the device are implemented. The interfaces can also be individual, integrated circuits or at least partially be made of separate components. For a software configuration, the interfaces may be software modules which can be found on a micro-controller along with other software modules.

A corresponding power electronic system with a power electronic device comprising at least one semiconductor component features one mentioned device for detecting an aging of the power electronic device. Advantageously, the device can be integrated as an addition into a known power electronic system.

An example of such a power electronic system is an inverter. Advantageously, the semi-sinusoidal excitation current refers to an obvious system excitation within the inverter. Thus, to provide the excitation signal, it is possible to fall back on a driver circuit that is anyway available in an inverter.

In accordance with one embodiment, the semiconductor component can refer to a bipolar transistor, in particular a bipolar transistor with an isolated gate electrode. The excitation current can represent a current flowing between the emitter and the collector of the bipolar transistor. The semiconductor component can furthermore refer to a field-effect transistor and the excitation current to a current flowing between the drain and source of the field effect transistor. The described approach is not limited to transistors but can also be applied to other semiconductor components. The semiconductor component can e.g. represent a diode and the excitation current can represent an electric current that flows between the anode and the cathode of the diode. Thus, a separate power source or heat source for the thermal excitation of the semiconductor is not required.

According to one embodiment, the power electronic device may comprise a carrier, a substrate for the thermal conduction from the semiconductor component to the carrier and a cooling element. The semiconductor component can hereby be connected to the substrate by means of a solder connection and the cooling element can be connected to the carrier via a thermally conductive layer. The aging value can indicate an aging of the solder connection and additionally or alternatively an aging of the thermally conductive layer. A carrier can be understood to be a base plate or bottom plate. The substrate can consist of an electrically insolated material, e.g. of ceramics. In this way the described approach can be used in connection with a typical configuration of a power electronic system.

A computer program product with a program code is also advantageous, which can be stored on a machine-readable carrier such as on a semiconductor storage, a hard drive storage or an optical storage and which can be used to carry out the method according to the previously described design example, when the program is executed on a computer or in a device.

DETAILED DESCRIPTION OF THE DRAWINGS AND THE PRESENTLY PREFERRED EMBODIMENTS

In the following description of preferred design examples of the present invention, same or similar reference signs are used for elements that are depicted in the various figures and that function in a similar manner, wherein a repeated description of these elements is omitted.

Figure 1:
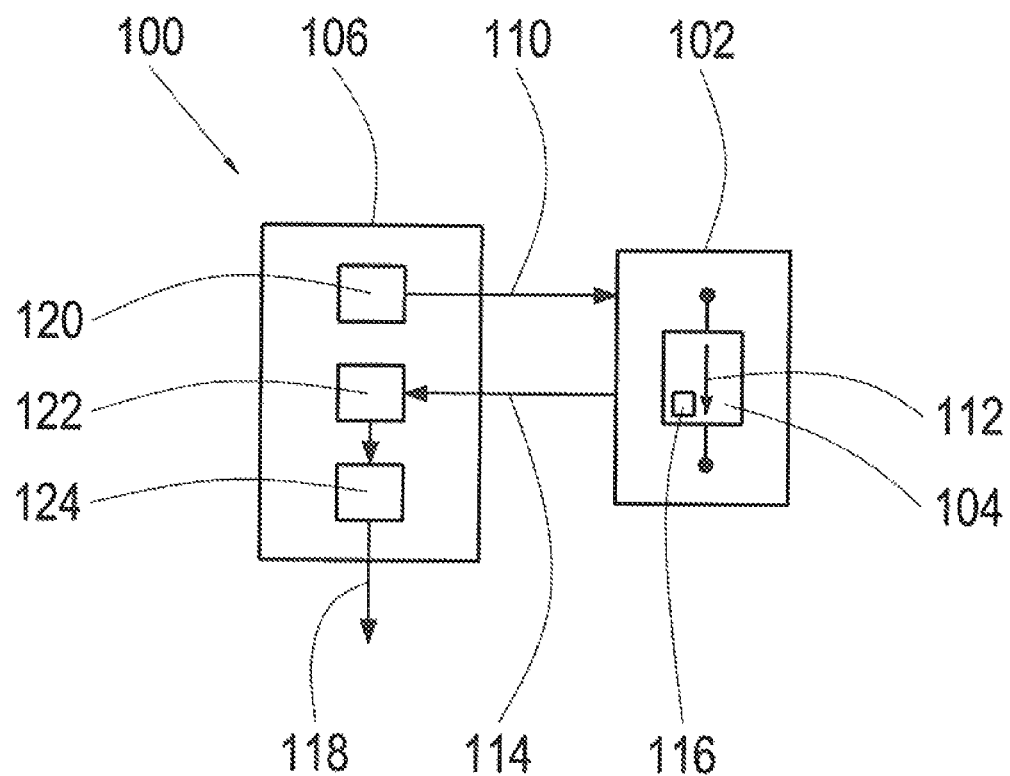
FIG. 1 is a schematic depiction of a power electronic system according to one design example.

FIG. 1 shows a schematic depiction of a power electronic system 100 according to one design example. The power electronic system 100 includes a power electronic device 102 with a semiconductor component 104 and a device 106 for detecting the aging at the power electronic device 102.

Device 106 is configured to provide an excitation signal 110 via an interface to the power electronic device 102, which is suitable to cause a semi-sinusoidal excitation of the semiconductor component 104. The excitation signal 110 is particularly suitable to cause a flow of a semi-sinusoidal excitation current 112 through the semiconductor component 104 and thus to cause the introduction of a semi-sinusoidal power loss into the semiconductor component.

If the semiconductor component 104 refers to a transistor, the excitation current 112 can flow between the emitter and the collector contact or between the drain and the source contact. In this case, the excitation signal 110 can be considered as a control signal in accordance with one design example, which is provided at one control input of the semiconductor component 104.

If the semiconductor component 104 refers to a diode, the excitation current 112 can flow between the anode and cathode contact of the semiconductor component 104. In this case, the excitation signal 110 can correspond to the excitation current 112 in accordance with one design example, it can represent an excitation voltage that falls off on the semiconductor device 104, which causes the excitation current 112 through the semiconductor element 104, or it can represent a control signal that triggers an element of the power electronic device 102 in such a way that the excitation current 112 flows through the semiconductor component 104.

The semiconductor component 104 is supplied with a power loss via the excitation current 112. The excitation current 112 thus leads to a heating up of the semiconductor component 104. The heat that is generated within the semiconductor component 104, is dissipated by means of thermal radiation or heat dissipation from the semiconductor component 104. Due to the semi-sinusoidal course of the excitation current, the temperature alternatingly rises and falls within the semiconductor component 104.

Device 106 is designed in order to upload a temperature signal 114 via an interface to the power electronic device 102. The temperature signal 114 represents the actual temperature within the semiconductor component 104. According to an design example, the temperature signal 114 is captured by using a temperature resistance 116 that is integrated into the semiconductor component 104.

Device 106 is designed in order to determine the condition of the power electronic device 102 concerning the aging of the power electronic device 102 by using the temperature signal 114. According to an design example, device 100 is configured to provide an aging value 118, which indicates whether an aging of the power electronic device 102 has occurred or not.

In accordance with this design example, device 106 features a provision unit 120, an uploading unit 122 and a determination unit 124.

The provision unit 120 is designed to provide the excitation signal 110. In accordance with various design examples, the provision unit 120 can be designed e.g. as a driver unit to trigger the semiconductor component 104 or a further element of the circuit, as an energy source for providing the excitation current 112 or merely as a line to conduct the excitation current 112. According to a design example, the provision unit 120 refers to a unit, which is anyway required for the operation of the power electronic device 102 and which carries out the providing of the excitation current as an additional function or in the course of a normal operation. According to a design example, the provision unit 120 is designed to provide the excitation signal 110 during a normal operation of the power electronic device 102 and in particular during a normal operation of the semiconductor component 104. In accordance with a design example, the excitation current 112 thus refers to a current that flows through the semiconductor component 104 during normal operation. According to an alternative design example, the excitation signal 110 is provided while the semiconductor component 104 is set in a test mode apart from its normal operation.

The uploading unit 122 is designed to upload the temperature signal 114. According to a design example, the uploading unit 122 further includes a detecting unit, which is configured to detect the temperature signal 114.

The determination unit 124 is designed to determine the aging value 118 by carrying out a suitable determining requirement based on the temperature signal 114 or to determine it from values that are derived from the temperature signal 114. To accomplish this, the determination unit 124 features e.g. a comparison unit or a reference table.

At least one of the units 120, 122, 124 of device 106 can be integrated into the power electronic device 102. It is particularly possible that at least one of the units 120, 122, 124 can at least partially be realized by means of a unit, which is anyway required for the operation of the power electronic device 102.

In accordance with an design example, the determination unit 124 is designed to evaluate an amplitude of the temperature signal 114 in order to determine the aging value 118. In order that the aging value 118 can be determined very accurately, the determination unit 124 is designed in such a way according to a design example, that it determines the aging value 118 based on at least one amplitude of the temperature signal 114 which is in a steady oscillation state. To increase the accuracy of the aging value 118, the determination unit 124 is designed in such a way in accordance with a design example, that it determines the aging value 118 based on an average amplitude of the temperature signal 114. An aging value 118 that is determined in this way is suitable, to e.g. indicate an aging in the area of the solder connection of the semiconductor component 104.

In accordance with an design example, the determination unit 124 is additionally or alternatively designed to evaluate a minimum value of the temperature signal 114 in order to determine the aging value 118. In order that the aging value 118 can be determined very accurately, the determination unit 124 is designed in such a way according to a design example, that it determines the aging value 118 based on the minimum value of the temperature signal 114 which is in a steady oscillation state. To increase the accuracy of the aging value 118, the determination unit 124 is designed in such a way in accordance with a design example, that it determines the aging value 118 based on an average minimum value of the temperature signal 114. An aging value 118 that is determined in this way is suitable, to e.g. indicate an aging in the area of a cooling element of the semiconductor component 104.

In accordance with a design example, the determination unit 124 is designed to provide two aging values, wherein one of the aging values is provided by using the amplitude and the other aging value by using the minimum value of the temperature signal 114.

Figure 2:
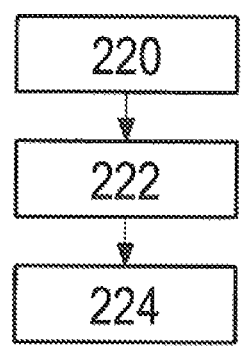
FIG. 2 is a flow chart of a method for detecting the aging of a power electronic device according to one design example.

FIG. 2 shows a flow chart of a method for detecting the aging of a power electronic device according to one design example which comprises at least one semiconductor component.

The method includes a step 220, in which an excitation signal is provided, which causes the introduction of a power loss, which features an at least approximately semi-sinusoidal course, into the semiconductor component. The excitation signal particularly triggers a flow of an at least approximately semi-sinusoidal excitation current through the semiconductor component. A temperature signal is upload during a step 224. The temperature signal represents a temporal course of the temperature, in particular of the temperature within the semiconductor component. An aging value is determined during a step 226, which represents the aging of the power electronic device. The aging value is determined by using the temperature signal.

The steps 220, 222, 224 of the method can be implemented by using e.g. units of the device for detecting an aging of a power electronic device described in accordance with FIG. 1 or by using units in accordance with the power electronic device described in FIG. 1.

Figure 3:
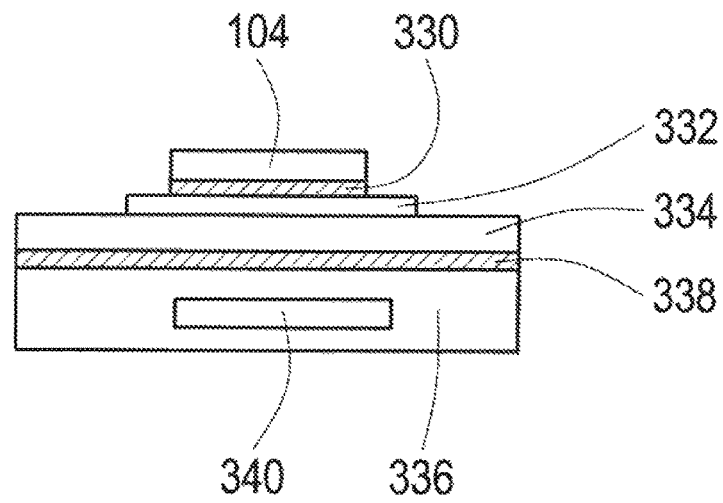
FIG. 3 is a schematic depiction of a power electronic device comprising a semiconductor component according to one design example.

FIG. 3 shows a schematic depiction of a power electronic device 102 comprising a semiconductor component 104 according to one design example. It can hereby refer to a known power electronic device as it is used e.g. in connection with an inverter.

The semiconductor component 104, for example in form of a chip, is connected to a substrate 332 via a solder connection 330. Substrate 332 is arranged on a carrier, in this case a base plate 334, which is also called a bottom plate. According to one design example, the substrate 332 can be made in form of a ceramics substrate and serves as an insulation and for the thermal conduction of the semiconductor component 104 to the base plate 334. On one side of the substrate 332, which faces away from the base plate 334, a cooling element 336 is arranged at the base plate 334 via a heat-conducting layer 338, e.g. in form of a heat conducting paste. In accordance with this design example, the cooling element 336 features a channel 340, in which a cooling fluid can pass through.

According to a design example, the heat which is generated within the semiconductor component 104 by means of the introduction of a power loss into the semiconductor component 104, is conducted to the cooling element 336 via the solder connection 330, the substrate 332, the base plate 334 and the heat-conducting layer 338, which cooling element serves as a heat sink.

By using the herein described approach, it is particularly possible to detect an aging in the area of the solder connection 330 as well as an aging in the area of the heat-conducting layer 338.

In accordance with a design example, at least one further semiconductor component 104 is arranged adjacent to the semiconductor component 104, which is connected to the base plate 334 via a further substrate.

Figure 4:
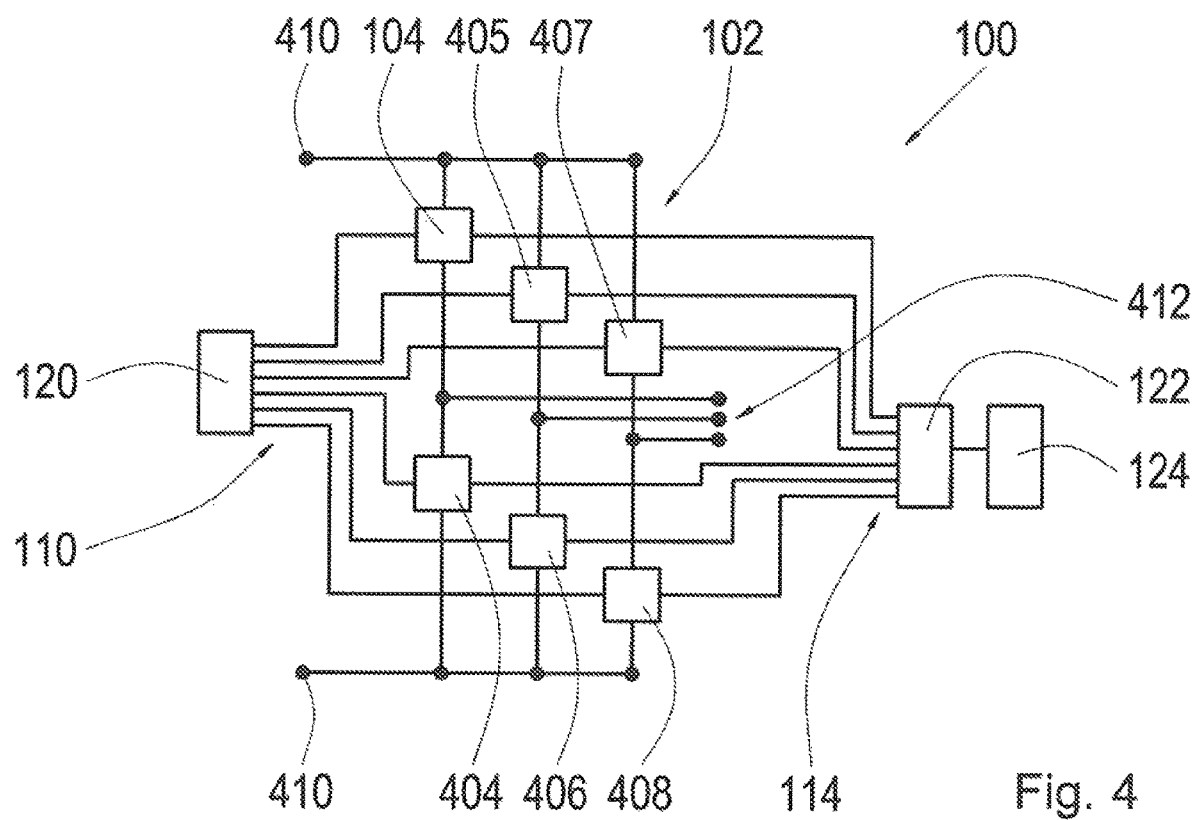
FIG. 4 is a schematic depiction of a power electronic system with a plurality of semiconductor components according to one design example.

FIG. 4 shows a schematic depiction of a power electronic system 100 with a power electronic device 102 comprising a plurality of semiconductor components 104, 404, 405, 406, 407, 408 in accordance with one design example. The semiconductor components 104, 404, 405, 406, 407, 408 are interconnected in an illustrative way in a B6-bridge circuit. According to one design example, the semiconductor components 104, 404, 405, 406, 407, 408 refer to elements, as they are described in line with the previous figures.

According to a design example, the semiconductor components 104, 404, 405, 406, 407, 408 are arranged as transistors in a power electronic device 102 that is configured as an inverter. The power electronic device 102 features two input connections 410 and three output connections 412. During the normal operation of the power electronic device 102, a DC-voltage is set at the input connections 410, from which a three-phase AC-voltage is generated by means of a suitable triggering of the semiconductor components 104, 404, 405, 406, 407, 408 and which is then provided at the output connections 412.

In order to determine an aging of the power electronic device 102, a provision unit 120 is intended, which is designed to provide an excitation signal 110, which comprises a plurality of partial excitation signals to the control connections of the semiconductor components 104, 404, 405, 406, 407, 408 in accordance with this design example. The semiconductor components 104, 404, 405, 406, 407, 408 are triggered via the excitation signal 110 in such a way that an at least approximately semi-sinusoidal excitation current flows through each one of them respectively by using the DC-voltage that is set at the input connections 410. It is hereby possible that different excitation currents, e.g. with a phase-shift towards each other, flow through the semiconductor components 104, 404, 405, 406, 407, 408. According to an design example, one PWM driver circuit is used as provision unit 120, which is used during normal operation of the power electronic device 102 that is designed as an inverter, to trigger the semiconductor components 104, 404, 405, 406, 407, 408.

An uploading unit 122 is intended to upload a temperature signal 114, which comprises a plurality of temperature signals in accordance with one design example. The individual temperature signals represent the actual temperatures within the individual semiconductor components 104, 404, 405, 406, 407, 408.

An evaluation device 124 is intended for determining an aging of the power electronic device 102 by using the temperature signal 114. Due to the existence of the partial temperature signals, the determination unit 124 is designed in accordance with a design example, to determine and provide aging values that are allocated to the individual semiconductor components 104, 404, 405, 406, 407, 408.

According to an alternative design example, the power electronic device 102 refers to a rectifier that is designed to transform the AC-voltage at the connections 412 into a DC-voltage and to supply it to the connections 410. In this case, the semiconductor components 104, 404, 405, 406, 407, 408 can refer to diodes. The excitation signal can be understood to be the AC-voltage at the connections 412 in this case and the provision unit can e.g. include the connections 412 along with the circuits connecting to the semiconductor components 104, 404, 405, 406, 407, 408.

Figure 5:
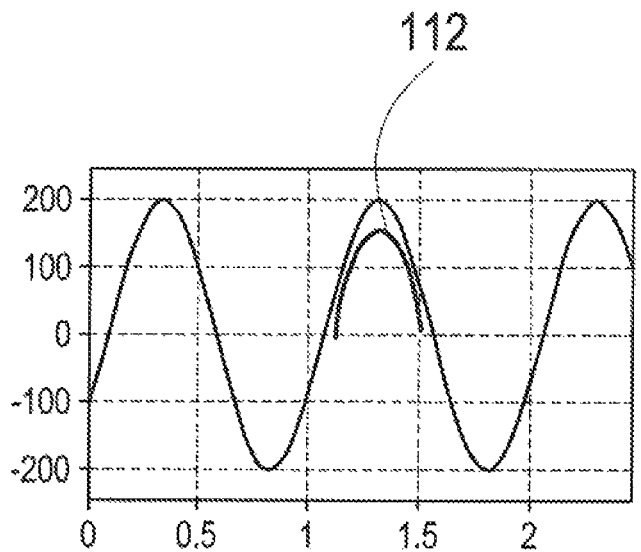
FIG. 5 is a depiction of a semi-sinusoidal excitation current according to one design example.

FIG. 5 shows a depiction of a semi-sinusoidal excitation, in particular a semi-sinusoidal excitation current 112 according to a design example. A chart is shown in which the time t in seconds is entered on the abscissa and a current $I_{AC}$ in ampere on the ordinate. The depicted current $I_{AC}$ features an oscillating sinusoidal course ranging between −200 A and +200 A. A positive semi-sinusoidal wave of the current is supplied as excitation current 112 to a semiconductor component, which is also referred to as "device under test" (DUT), in order to trigger an excitation of the thermal resistance of the semiconductor component near the chip.

Figure 6:
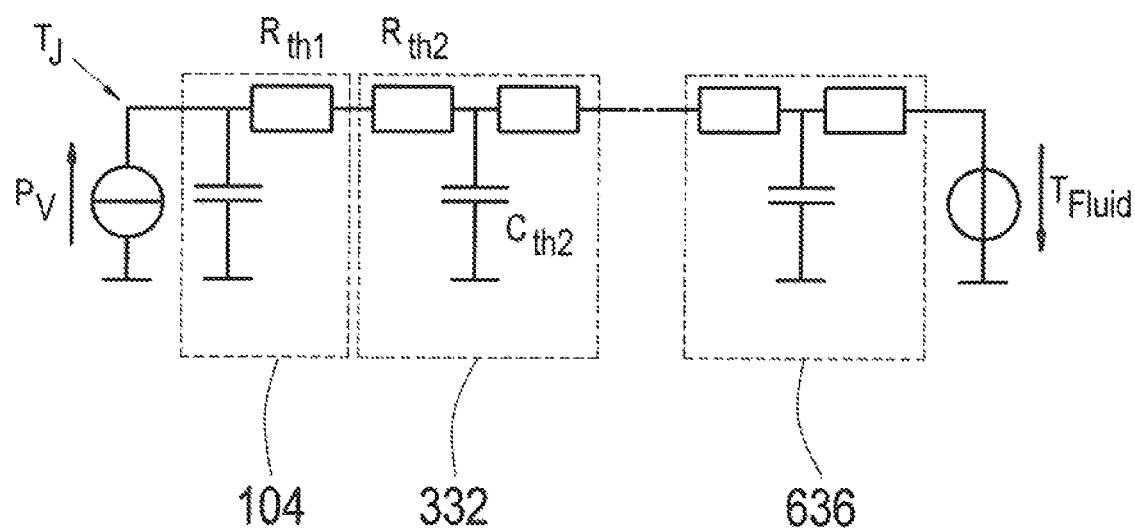
FIG. 6 is a schematic depiction of an excitation of a power electronic system according to one design example.

FIG. 6 shows a schematic depiction of an excitation of a power electronic device 102 according to a design example. As it is explained e.g. in line with FIG. 3, the power electronic device 102 comprises a semiconductor component 104, in this case in form of a chip, a substrate 332 and a cooling system 636, which may include a cooling fluid that flows through the cooling element. The arrangement of the semiconductor component 104 and of the substrate 332 can also be referred to as power semiconductor module or power module.

By means of an excitation current, as it is shown e.g. in line with FIG. 5, a power loss $P_V$ is introduced into the semiconductor component 104, which has an effect on a temperature, in this case the junction temperature $T_J$ within the semiconductor component 104. A first thermal resistance $R_{th1}$ is allocated to the semiconductor component 104 and a second thermal resistance $R_{th2}$ to the substrate 332. In accordance with one design example, a semi-sinusoidal excitation of the thermal resistance $R_{th1}$ is carried out by means of the excitation current. Heat energy is dissipated from the cooling system 636 by means of a cooling fluid, which features a temperature $T_{Fluid}$.

In the following, the described approach is explained based on a design example in the form of a method for the onboard aging identification of power semiconductor module 104, 332 and of cooling system 636.

Known failure occurrences of a power module 104, 332 are the loosening of bonding wires and the aging of solder connections within a module, as they are schematically depicted in FIG. 3 as a solder connection. Bonding errors lead to an increase in the resistance of the electrical supply line and can be monitored by measuring the collector-emitter voltage $U_{CE}$ by means of a defined collector current. The loosening or a wire, also called "lift-off", accelerates the loosening of further wires, by means of which module 104, 332 can fail within a short period of time. Thus, the $U_{CE}$ measurement often merely allows for an "end-of-life" identification.

However, by means of using the herein described excitation current for the monitoring of the semiconductor component 104, it is possible to make a statement regarding the condition of the module as well as to estimate the remaining lifespan. Based on such a such a statement, it can be decided whether a module 104, 332 needs to be exchanged as a preventive measure, or whether it will continue to function until the following inspection.

The aging of solder connections leads to a slower increase of the stationary thermal resistance $R_{th}$ and thus allows for a longer advance warning time.

Additionally, the aging of the cooling system 636 or of the heat-conducting paste, as it is schematically depicted as heat-conducting layer in FIG. 3, also leads to an increase of the stationary thermal resistance.

For an error-selective determining of the aging of the power module 104, 332 and of the cooling system 636, a measuring of the thermal impedance $Z_{th}$ can be carried out additionally by using the $U_{CE}$ method. To accomplish this, the power module is heated up by means of a DC heating current and the cooling curve is then measured after its abrupt switch-off. Even though this method for the $R_{th}$ and $Z_{th}$ measuring can be carried out in line with a separate diagnosis phase, i.e. for example not in line with a regular inverter operation in a motor vehicle, e.g. while standing at a traffic light, its integration in a motor vehicle inverter or in an inverter of a wind energy system is less suitable due to the necessary equipment and measuring accuracy.

For an identification of the aging of a power module 104, 332, which is running in an application, the power semiconductor 104 can additionally be warmed up by means of a heat impulse, which is e.g. implemented by means of a bridge short-circuit with a reduced control voltage. The $U_{CE}$ method can be used again to measure the cooling curve, and the aging of the power module can be derived thereof. The advantage of this method is the short heating of the semiconductor 104, while material layers that are situated below, such as the substrate 332 and the base plate, do not experience the increase in temperature. A big temperature difference thus occurs above the solder layer, which improves the measuring accuracy. An identification of the condition of the cooling system is not possible. Furthermore, the realization of a bridge short-circuit is not allowed in an inverter due to security reasons.

Instead, a rectangular-shaped heating current profile can also be used, which is implemented by means of an additional heating current source. After three heating pulses by means of the $U_{CE}$ method, the junction temperature $T_J$ is measured. For an identification of a critical state of the aging, this measured value is compared to a measured value that was stored during system delivery. However, to accomplish this, an extensive implementation effort with an additional heating current source is required and only a single point measuring of the temperature is carried out and a monitoring of the cooling system is not possible.

Such methods can be used as a complement to the herein described approach by using the semi-sinusoidal excitation. In contrast to methods for the identification of the aging that are based on a system excitation that is abruptly changing, impulse- or rectangular-shaped and a measuring of the cooling behavior within a period of time by means of the $U_{CE}$ method, this described approach based on the use of a semi-sinusoidal excitation can be carried out without the necessity of precise laboratory technology and the requirement of an additional heating current source. Additionally, a high robustness against external interferences and influences is provided. The herein described approach based on the use of a semi-sinusoidal excitation presents an implementable solution which is suitable for series production for an "onboard" aging identification of a power module 104, 332 and a cooling system 636 as it is e.g. integrated in a motor vehicle inverter or in a wind inverter.

In contrast to a system excitation that is abruptly changing, impulse- or rectangular-shaped and a temperature measuring within a period of time, the herein presented approach describes a semi-sinusoidal excitation with a low electrical frequency $f_{ef} \sim 1$ Hz. This frequency is chosen in such a way, that periodically a particularly high temperature difference is achieved above the thermal resistance $R_{th1}$, which increases along with a degradation of the chip solder (compare thermal Cauer-equivalent circuit diagram in FIG. 6), by means of which the measuring sensitivity of the $R_{th1}$ monitoring is improved. In conventionally configured power modules 104, 332, this frequency is found at the low-pass frequency of the ceramics substrate 332 ($R_{th2}$, $C_{th2}$) in the range around $f_{ef} \sim 1$ Hz.

The advantage of a frequency excitation is the possibility of an averaging of measuring values over a longer period of time. The described semi-sinusoidal excitation can furthermore be implemented without an additional heating current source or a bridge short-circuit, by means of the simple control of an inverter, e.g. with a power factor of $\cos \varphi = 0$. In this way, only a reactive current flows during the system excitation and no torque occurs at the electric engine.

An exemplary phase current $I_{AC}$, whose positive semi-sinusoidal wave flows through a semiconductor component 104 in form of an IGBT ("device under test") and which leads to a semi-sinusoidal power loss $P_V$ in the IGBT is depicted in FIG. 5. In a pulse inverter, it is thus possible to stimulate and measure all semiconductor components 104, i.e. all IGBT's at the same time.

Exemplary system responses to the semi-sinusoidal excitation are depicted in the following figures.

Figure 7:
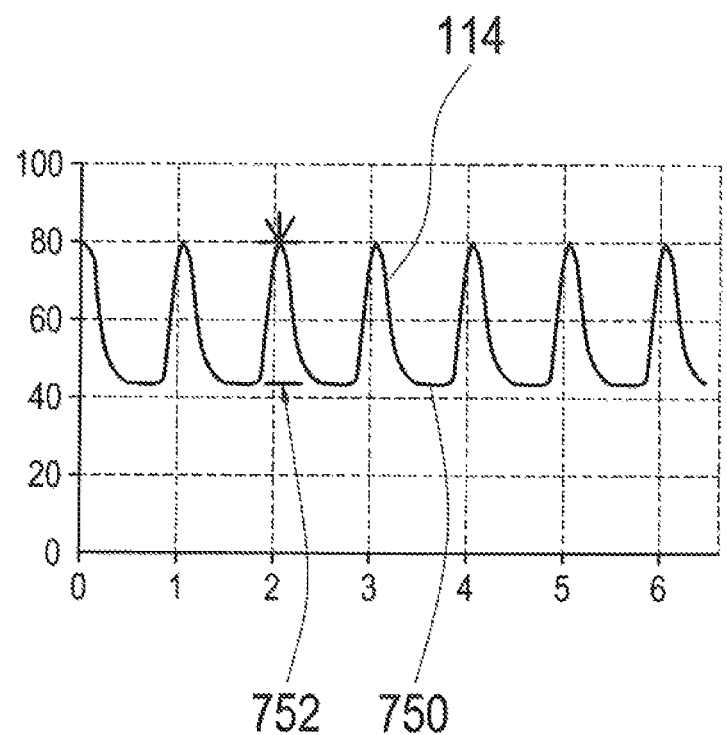
FIG. 7 is a temperature signal of a not aged power electronic device in accordance with one design example.

FIG. 7 depicts a temperature signal 114 of a non-aged power electronic device in accordance with a design example. It can hereby refer to a power electronic device as it is described in accordance with the previous figures. The temperature signal 114 features a cyclical course with successive temperature rises and temperature drops. The time t in seconds is entered on the abscissa and the temperature $T_J$ in ° C. on the ordinate. Within the depicted time span of approximately six seconds, the temperature signal 114 features a minimum value 750 of $T_{J,Min}=42°$ C. in this example. The temperature signal 114 features approximately seven cycles with an amplitude 752 of e.g. $\Delta T_J=37°$ C. within the depicted time span. The temperature signal 114 is in a steady oscillation state, so that the individual cycles of the oscillation of the temperature signal 114 are almost identical.

Figure 8:
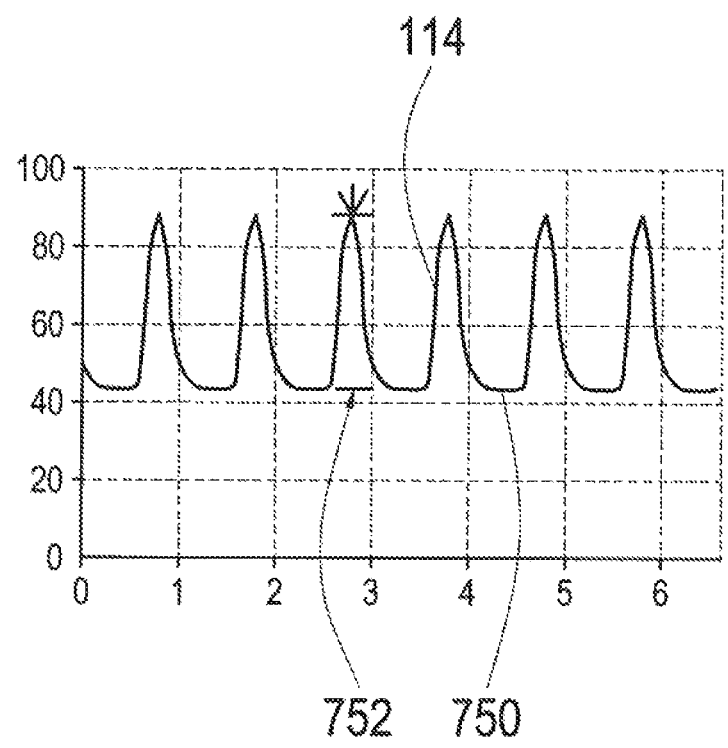
FIG. 8 is a temperature signal of an aged power electronic device in accordance with one design example.

FIG. 8 depicts a temperature signal 114 of an aged power electronic device in accordance with a design example. The temperature signal 114 differs in its amplitude 752 from the temperature signal shown in FIG. 7. Within the depicted time span of also approximately six seconds, the temperature signal 114 features a minimum value 750 of $T_{J,Min}=42°$ C. The temperature signal 114 features approximately seven cycles with an amplitude 752 of $\Delta T_J=44°$ C. within the depicted time span. The temperature signal 114 is in a steady oscillation state, so that the individual cycles of the oscillation of the temperature signal 114 are almost identical.

The temperature cycles of a new and of an aged power electronic device, e.g. in form of a power module, as they are represented by the temperature signal 114, thus differ in that the temperature signal of the aged power electronic device features a larger amplitude 752.

By means of the FIGS. 7 and 8, an evaluation of the temperature signal 114 is described in the following which serves as a system response or which includes a system response.

In accordance with an design example, the amplitude 752 $\Delta T_J$ and the minimum junction temperature 750 $T_J$,Min of the temperature cycles from the system excitation are measured as system response. The measuring of this value is particularly advantageous after it has reached its stable oscillating thermal state over a longer period of time, e.g. for more than 30 seconds. This enables a statement about the amplitude 752 and the minimum temperature 750 across several temperature cycles and results in a most accurate and stable measurement of this value.

For the measuring of the junction temperature and thus for the generating of the temperature signal 114, a suitable driver circuit can be used as it is used in connection with a temperature measurement at a temperature measuring resistance of a semiconductor component.

An increase of the amplitude 752 $\Delta T_J$ characterizes the aging of the power module, in particular an aging of at least one solder connection within the power module, whereas the minimum temperature 750 $T_{J,Min}$ increases with the aging of the heat-conducting paste and/or of the cooling system. FIGS. 7 and 8 depict the junction temperature of a new and of a herein artificially aged power module in its stable oscillating thermal state by means of the temperature signal 114.

Caused by the aging, an increase of the amplitude 752 $\Delta T_J$ from 37° C. to 44° C., or an increase of +19% can be observed. This is in accordance with the stop criterion for an artificial aging of an $R_{th}$ increase of 20%. The unchanged minimum temperature 750 $T_{J,Min}=42°$ C. does not allow any conclusions regarding an aging of the heat-conducting paste and of the cooling system. A reduction of the cooling fluid flow rate from e.g. 10 l/min to 5 l/min, which corresponds to a soiling of the cooling element or of an aging of the heat-conducting paste, results in an increase of the minimum temperature 750 $T_{J,Min}$ to e.g. 46° C., while the amplitudes of the temperature cycles are not affected by this. The evaluation of the amplitude 752 and of the minimum temperature 750 thus enables the error-selective identification of the aging state of the power module and of the cooling system.

For the monitoring of the aging, the amplitude 752 and the minimum temperature 750 are detected in regular diagnosis phases in accordance with a design example and are then compared to values that were e.g. stored during system delivery.

Alternatively, the introduced power loss and the measured junction temperature can be used to calculate and monitor thermal partial resistances.

Figure 9:
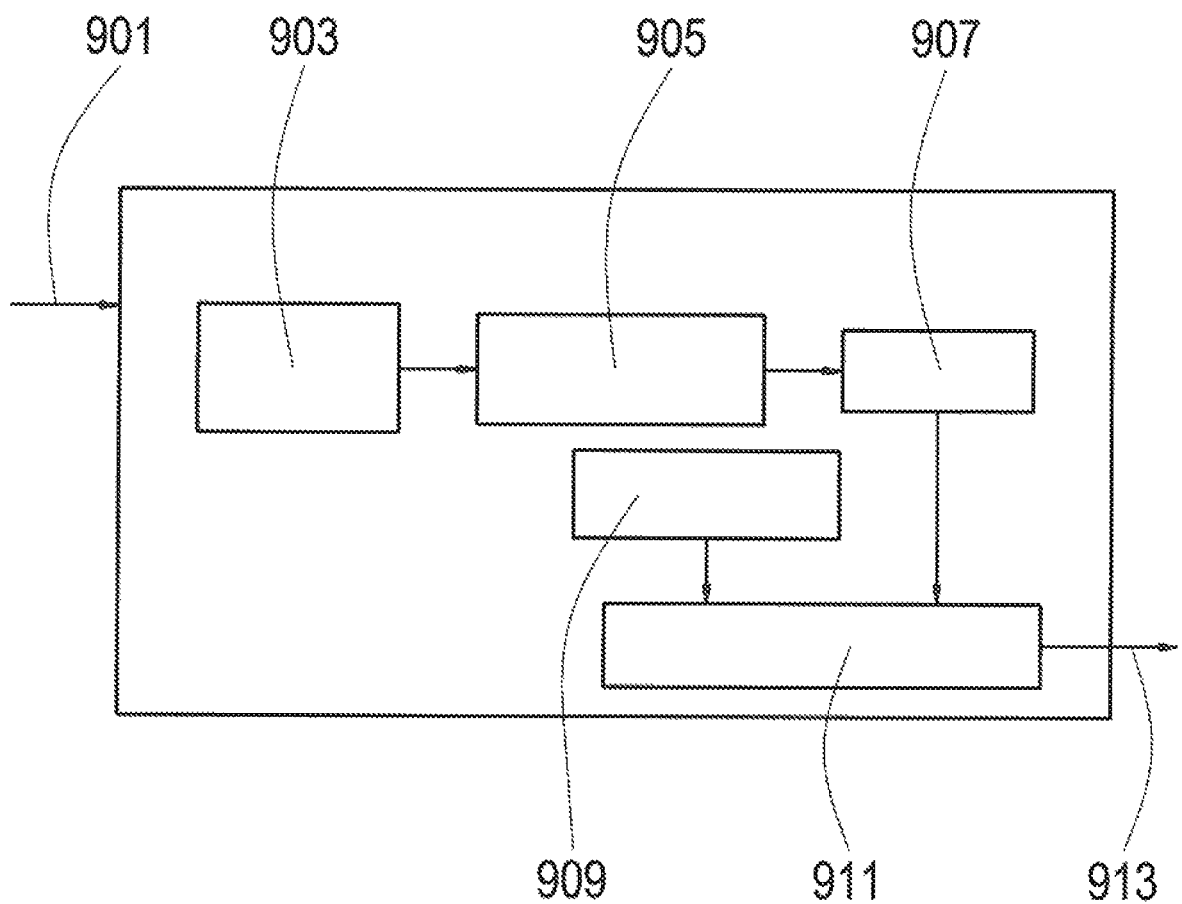
FIG. 9 is a flow chart of a method for detecting the aging of a power electronic device according to one design example.

FIG. 9 shows a flow chart of a method for detecting the aging of a power electronic device according to a design example. The method is carried out in connection with a diagnosis phase. The method is illustrated as a flowchart of an onboard aging identification.

After a start 901 of the method, a semi-sinusoidal excitation with a frequency of $f_{el}$ of approximately 1 Hz is carried out in step 903, for example by using a PWR control with cos φ=0 and $I_{AC}$=200 A.

In a step 905, a measuring or determining of the amplitude $\Delta T_J$ and of the minimum temperature $T_{J,Min}$ is carried out in the 1 Hz temperature cycles which are in a stable oscillating thermal state.

In a step 907, an averaging of the amplitude $\Delta T_J$ and of the minimum temperature $T_{J,Min}$ is carried out across several cycles.

In a step 909, reference values $\Delta T_{J,Ref}$ and $T_{J,Min,Ref}$ for the amplitude and for the minimum temperature, which were stored during system delivery, are provided.

In a step 911, an evaluation of whether the power module and/or the cooling system has aged, is carried out. This is accomplished in accordance with a design example in line with the following criteria:

If $\Delta T_J > \Delta T_{J,Ref}$ then it can be derived that the power module has aged.

If $\Delta T_{J,Ref} > T_{J,Min,Ref}$ it can be derived that the cooling system has aged.

If $\Delta T_J > \Delta T_{J,Ref}$ and $\Delta T_{J,Ref} > T_{J,Min,Ref}$ it can be derived that the power module and the cooling system have aged.

As a result of the evaluation in step 911, a aging state 913 of the power module and of the cooling system is released.

In accordance with a design example, step 903 is carried out in line with the step of providing, which was described according to FIG. 2. Step 905 can be carried out ahead of the step of uploading as it was described according to FIG. 2, in that the temperature of the semiconductor component is measured. Alternatively, step 905 can be carried out together with the optional step 907 as well as with step 911 in line with the step of determining as it was described according to FIG. 2, in that the amplitude and the minimum temperature is primarily determined from the temperature signal and that it is then used to determine the aging state 913. The aging state 913 can be understood to be the aging value as it was described according to FIG. 2.

In the following, a design example of a method for detecting an aging of a power electronic device in form of an inverter is described in detail in accordance with FIG. 9.

During the diagnosis phase in step 903, a system excitation with a semi-sinusoidal power loss featuring a low electrical frequency of $f_{el}$~1 Hz and a defined phase current of e.g. $I_{AC}$=200 A is initially started, as it is shown e.g. in FIG. 5. An implementation of this system excitation is e.g. possible by operating the inverter with a power factor of cos φ=0. All IGBT's are thus equally excited within one pulse inverter. It is thus possible to identify the aging state of all IGBT's by carrying out this one-time diagnosis phase.

As a system response, the amplitude $\Delta T_J$ and the minimum value $T_{J,Min}$ of the temperature cycles of the junction temperature of each IGBT are measured, uploaded or determined in step 905 after having reached a stable oscillating thermal state. Exemplary values for the amplitude $\Delta T_J$ and the minimum value $T_{J,Min}$ are e.g. mentioned in line with the FIGS. 7 and 8. For the measuring of the junction temperature, it is possible to use e.g. a suitable IGBT driver concept.

Advantageously, an averaging of the measured amplitude $\Delta T_J$ and the minimum temperature $T_{J,Min}$ across several semi-sinusoidal waves, e.g. across 15 semi-sinusoidal waves, is optionally carried out in step 907. This enables a very accurate and stable measuring of the aging state without the use of precise laboratory technology.

For the monitoring of the aging, the amplitude and the minimum temperature are detected in regular diagnosis phases in accordance with a design example and are then compared to reference values $\Delta T_{J,Ref}$ and $T_{J,Min,Ref}$ that were e.g. stored during system delivery. Alternatively, the introduced power loss $P_V$ and the measured amplitude and minimum temperature are used to calculate thermal partial resistances $R_{th,i}$ and are compared with the reference values $R_{th,i,Ref}$.

According to a design example, the diagnosis phase is started 901 within defined time intervals such as maintenance or inspection intervals. The aging state 913 can be released by the power module and/or by the cooling system, e.g. as a digital value or in form of digital data. It is e.g. also possible to release the aging state 913 in form of a signal light.

The described method thus uses a diagnosis phase in accordance with a design example, in which the power module that is to be examined is excited with a semi-sinusoidal power loss or a phase current profile with a low electrical frequency, during which the amplitude and minimum temperature of the resulting temperature cycles are measured.

If a design example includes an "and/or"-link between a first characteristic and a second characteristic, this can be understood in such a way, that the design example according to one embodiment features both, the first characteristic as well as the second characteristic and according to a further embodiment either only the first characteristic or only the second characteristic.

LIST OF REFERENCE SIGNS

100 Power electronic system
102 Power electronic device
104 Semiconductor component
106 Device for detecting an aging
110 Excitation signal
112 Excitation current
114 Temperature signal
116 Temperature measuring resistance
118 Aging value
120 Provision unit
122 Uploading unit
124 Determination unit
220 Step of providing
222 Step of uploading
224 Step of determining
330 Solder connection
332 Substrate 334 Base plate
336 Cooling element
338 Heat-conductive layer
340 Channel
404 Semiconductor component
405 Semiconductor component
406 Semiconductor component
407 Semiconductor component
408 Semiconductor component
410 Input connections
412 Output connections
636 Cooling system
750 Minimum temperature
752 Amplitude
901 Start
903 Step of system excitation
905 Step of measuring
907 Step of averaging
909 Step of providing of reference values
911 Step of evaluating
913 Aging state

What is claimed is:

1. A method for detecting an aging of a power electronic device that comprises at least one semiconductor component, the method comprising:
providing an excitation signal configured to trigger a flow of an at least approximately semi-sinusoidal excitation current through the semiconductor component in order to introduce a power loss into the semiconductor component;
uploading a temperature signal, which represents a temporal course of a temperature of the semiconductor component; and
determining an aging value that represents the aging of the power electronic device by using the temperature signal, wherein the determining further comprises:
determining a minimum value of the temperature signal;
determining an amplitude of the temperature signal comprising, at least in part, determining a difference between a maximum value of the temperature signal and the minimum value of the temperature signal;
comparing the minimum value to a reference minimum value to determine whether the minimum value is bigger than the reference minimum value;
comparing the amplitude to a reference amplitude to determine whether the amplitude is bigger than the reference amplitude;
determining a first aging value, which indicates an aging at the semiconductor component, in response to determining that the amplitude is bigger than the reference amplitude; and
determining a second aging value, which indicates an aging of a cooling device of the power electronic device, in response to determining that the minimum value is greater than the reference minimum value.

2. The method of claim 1, wherein the determining the aging value further comprises a comparison between a thermal resistance and a reference thermal resistance, wherein the thermal resistance is determined by using the amplitude, the minimum value and the power loss that is introduced into the semiconductor component.

3. The method of claim 1, wherein the determining the amplitude of the temperature signal further comprises using an average amplitude of the temperature signal.

4. The method of claim 1, wherein the determining the aging value further comprises determining when the temperature signal features a steady oscillation state.

5. The method of claim 1, wherein the uploading the temperature signal further comprises uploading from an interface of a resistance that is integrated into the semiconductor component.

6. The method of claim 1, wherein the providing the excitation signal further comprises supplying the excitation signal to a control input of the semiconductor component, the semiconductor component comprising a transistor.

7. The method of claim 1, wherein the providing the excitation signal is further designed to trigger further comprises triggering a flow of an additional semi-sinusoidal excitation current through an additional semiconductor component of the power electronic device in order to introduce an additional power loss into the additional semiconductor component;
wherein the uploading the temperature signal further comprises uploading an additional temperature signal, which represents a temporal course of a temperature of the additional semiconductor component; and
wherein the determining the aging value further comprises determining an additional aging value, which represents the aging of the power electronic device by the use of the additional temperature signal.

8. A device for detecting an aging of a power electronic device comprising at least one semiconductor component, the device comprising:
a provision unit configured to provide an excitation signal, wherein the excitation signal is configured to trigger a flow of an at least approximately semi-sinusoidal excitation current through the semiconductor component in order to introduce a power loss into the semiconductor component;
an uploading unit configured to upload a temperature signal which represents a temporal course of a temperature of the semiconductor component; and
an evaluation unit configured to determine an aging value that represents an aging of the power electronic device by using the temperature signal, wherein the evaluation unit is configured to:
determine a minimum value of the temperature signal;
determine an amplitude of the temperature signal at least in part by determining a difference between a maximum value of the temperature signal and the minimum value of the temperature signal;
compare the minimum value to a reference minimum value to determine whether the minimum value is bigger than the reference minimum value;
compare the amplitude to a reference amplitude to determine whether the amplitude is bigger than the reference amplitude;
determine a first aging value, which indicates an aging at the semiconductor component, in response to determining that the amplitude is bigger than the reference amplitude; and
determine a second aging value, which indicates an aging of a cooling device of the power electronic device, in response to determining that the minimum value is greater than the reference minimum value.

9. A power electronic system comprising:

a power electronic device comprising at least one semiconductor component; and a device for detecting an aging of the power electronic device, the device comprising:

a provision unit configured to provide an excitation signal, wherein the excitation signal is configured to trigger a flow of an at least approximately semi-sinusoidal excitation current through the semiconductor component in order to introduce a power loss into the semiconductor component;

an uploading unit configured to upload a temperature signal which represents a temporal course of a temperature of the semiconductor component; and an evaluation unit configured to determine an aging value that represents an aging of the power electronic device by using the temperature signal, wherein the evaluation unit is configured to:

determine a minimum value of the temperature signal;

determine an amplitude of the temperature signal at least in part by determining a difference between a maximum value of the temperature signal and the minimum value of the temperature signal;

compare the minimum value to a reference minimum value to determine whether the minimum value is bigger than the reference minimum value;

compare the amplitude to a reference amplitude to determine whether the amplitude is bigger than the reference amplitude;

determine a first aging value, which indicates an aging at the semiconductor component, in response to determining that the amplitude is bigger than the reference amplitude; and determine a second aging value, which indicates an aging of a cooling device of the power electronic device, in response to determining that the minimum value is greater than the reference minimum value.

10. The power electronic system of claim 9, wherein the power electronic system comprises an inverter.

11. The power electronic system of claim 9, wherein, at least one of:

the semiconductor component comprises a bipolar transistor and the excitation current comprises a current flowing between an emitter and a collector of the bipolar transistor;

the semiconductor component comprises a field-effect transistor and the excitation current comprises a current flowing between a drain and a source of the field-effect transistor; or the semiconductor component comprises a diode and the excitation current comprises a current that flows between an anode and a cathode of the diode.

12. The power electronic system of claim 9, wherein the power electronic device further comprises a carrier, a substrate for thermal conduction from the semiconductor component to the carrier and a cooling element;

wherein the semiconductor component is connected to the substrate via a solder connection and the cooling element is connected to the carrier via a thermally conductive layer; and wherein at least one of the first aging value or the second aging value indicates at least one of an aging of the solder connection or an aging of the thermally conductive layer.

13. The power electronic system of claim 9, wherein the evaluation unit is further configured to:

compare a thermal resistance and a reference thermal resistance, wherein the thermal resistance is determined by using the amplitude, the minimum value and the power loss that is introduced into the semiconductor component.

14. The method of claim 1, wherein the determining of the minimum value further comprises using an average minimum value of the temperature signal.

15. The power electronic system of claim 9, wherein the evaluation unit is further configured to:

determine the aging value when the temperature signal features a steady oscillation state.

16. The power electronic system of claim 9, wherein the at least one semiconductor component comprises:

a resistance that is integrated into the semiconductor component: and an interface to the resistance, and wherein the uploading unit is further configured to upload the temperature signal from the interface.

* * * * *